United States Patent
Bonaccio et al.

(10) Patent No.: US 9,252,717 B2
(45) Date of Patent: Feb. 2, 2016

(54) PHASE NOISE REDUCTION IN LC-VCO

(71) Applicant: INTERNATIONAL BUSINESS MACHINES CORPORATION, Armonk, NY (US)

(72) Inventors: Anthony R. Bonaccio, Shelburne, VT (US); Zhenrong Jin, Essex Junction, VT (US); Ram Kelkar, South Burlington, VT (US); Anjali R. Malladi, Williston, VT (US); Ramana M. Malladi, Williston, VT (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 14/295,794

(22) Filed: Jun. 4, 2014

(65) Prior Publication Data

US 2015/0357977 A1 Dec. 10, 2015

(51) Int. Cl.
*H03B 5/08* (2006.01)
*H03F 1/26* (2006.01)
*H03B 5/12* (2006.01)
*H03B 5/10* (2006.01)
*H03B 5/34* (2006.01)

(52) U.S. Cl.
CPC .. *H03F 1/26* (2013.01); *H03B 5/10* (2013.01); *H03B 5/1212* (2013.01); *H03B 5/1225* (2013.01); *H03B 5/1228* (2013.01); *H03B 5/34* (2013.01); *H03F 2200/372* (2013.01)

(58) Field of Classification Search
CPC .......... H03B 5/34; H03B 5/10; H03B 5/1212; H03B 5/1225; H03B 5/1228; H03F 1/26; H03F 2200/372
USPC ......... 331/167, 177 V, 116 FE, 116 R, 117 R, 331/117 FE; 330/277
See application file for complete search history.

(56) References Cited

U.S. PATENT DOCUMENTS

| | | | |
|---|---|---|---|
| 4,491,750 A | 1/1985 | Janutka | |
| 6,043,719 A | 3/2000 | Lin et al. | |
| 6,097,253 A * | 8/2000 | Hissen | 330/277 |
| 6,812,802 B1 | 11/2004 | Godambe et al. | |
| 7,161,442 B2 | 1/2007 | Hong et al. | |
| 7,292,115 B2 | 11/2007 | Soltanian et al. | |
| 7,652,520 B2 | 1/2010 | Gatta | |
| 7,671,689 B2 | 3/2010 | Deng et al. | |
| 7,936,223 B2 | 5/2011 | Little et al. | |
| 8,120,428 B2 | 2/2012 | Montalvo et al. | |
| 8,514,028 B2 | 8/2013 | Ding et al. | |
| 2008/0111644 A1* | 5/2008 | Jang et al. | 331/167 |
| 2011/0285464 A1 | 11/2011 | Montalvo et al. | |

(Continued)

FOREIGN PATENT DOCUMENTS

WO 2013074076 5/2013

*Primary Examiner* — Arnold Kinkead
(74) *Attorney, Agent, or Firm* — Anthony Canale; Andrew M. Calderon; Roberts Mlotkowski Safran & Cole, P.C.

(57) ABSTRACT

An approach for a transconductance cell for use in a voltage controlled oscillator (VCO) is provided. The transconductance cell includes a first NFET stack connected in series to a first PFET stack. The transconductance cell includes a second NFET stack connected in series to a second PFET stack. The first NFET stack and the first PFET stack are cross-coupled to the second NFET stack and the second PFET stack. The first NFET stack and the second NFET stack are connected to a tail node. The first PFET stack and the second PFET stack are connected to a power supply node.

20 Claims, 7 Drawing Sheets

(56) References Cited

U.S. PATENT DOCUMENTS

| | | |
|---|---|---|
| 2012/0235759 A1 | 9/2012 | Pfeiffer et al. |
| 2012/0242410 A1 | 9/2012 | Darwish et al. |
| 2012/0286889 A1 | 11/2012 | Park et al. |
| 2013/0169374 A1 | 7/2013 | Huang et al. |

* cited by examiner

PHASE NOISE REDUCTION IN LC-VCO

FIELD OF THE INVENTION

The present invention relates to integrated circuits and, more particularly, to reducing noise in a voltage controlled oscillator (VCO).

BACKGROUND

In general, a VCO (voltage controlled oscillator) is an oscillator circuit that outputs an AC signal having a frequency that varies in response to an input control voltage. VCOs are fundamental components that are employed in a broad range of applications including radar and communications systems (e.g., wireline or wireless applications) for data transfer and recovery processes. By way of example, VCOs are utilized for PLL (phase locked loop) circuits, DLL (delay locked loop) circuits, or injection locked oscillators. VCOs are further employed for applications such as frequency translation, data modulation, clock distribution and clock/data recovery. There are many different types of VCOs, with one type being an LC-VCO that includes an inductor-capacitor (LC) oscillator (also called a resonator).

Phase noise is instantaneous variations in the frequency of oscillation in LC-VCOs and is related to intrinsic properties of the devices such as: flicker noise and thermal noise of transistors, and the Q factor of inductor-capacitor network. Phase noise can also be caused by various loss elements, such as resistances which may vary with variations of temperature, load, and processing. Phase noise directly affects signal jitter, which is undesirable for clock signal applications.

SUMMARY

In a first aspect of the invention, there is a transconductance cell for use in a voltage controlled oscillator (VCO). The transconductance cell comprises a first NFET stack connected in series to a first PFET stack. The transconductance cell also comprises a second NFET stack connected in series to a second PFET stack. The first NFET stack and the first PFET stack are cross-coupled to the second NFET stack and the second PFET stack. The first NFET stack and the second NFET stack are connected to a tail node. The first PFET stack and the second PFET stack are connected to a power supply node.

In another aspect of the invention, a voltage controlled oscillator comprises: an inductor connected between a first node and a second node; at least one varactor connected between the first node and the second node; and a transconductance cell connected between the first node and the second node. The transconductance cell comprises: a first NFET set connected in series to a first PFET set; and a second NFET set connected in series to a second PFET set. The first NFET set and the first PFET set are cross-coupled to the second NFET set and the second PFET set. The first NFET set and the second NFET set are connected to a tail node that is selectively switched to ground. The first PFET set and the second PFET set are connected to a power supply node. At least one of: the first NFET set and the second NFET set each comprises a pair of stacked NFETs, and the first PFET set and the second PFET set each comprises a pair of stacked PFETs.

In yet another aspect of the invention, a method comprises fabricating a transconductance cell for use in a voltage controlled oscillator (VCO). The transconductance cell comprises: a first NFET stack connected in series to a first PFET stack; and a second NFET stack connected in series to a second PFET stack. The first NFET stack and the first PFET stack are cross-coupled to the second NFET stack and the second PFET stack. The first NFET stack and the second NFET stack are connected to a tail node that is selectively connected to ground by a switch. The first PFET stack and the second PFET stack are connected to a power supply node that supplies a rail voltage.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of a transconductance cell which comprises the structures of the present invention. In still further embodiments, a method in a computer-aided design system is provided for generating a functional design model of the transconductance cell. The method comprises generating a functional representation of the structural elements of the transconductance cell.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The present invention relates to integrated circuits and, more particularly, to reducing noise in voltage controlled oscillators (VCOs). According to aspects of the invention, a transconductance cell is structured and arranged using stacked transistor pairs. In this manner, implementations of the invention provide a transconductance cell that provides improved noise performance for a VCO.

The circuits and/or circuit elements of the present invention may be implemented using semiconductor structures, which can be manufactured in a number of ways using a number of different tools. In general, and unless otherwise noted herein, the methodologies and tools are used to form structures with dimensions in the nanometer or micrometer scale. The methodologies, i.e., technologies, employed to manufacture the semiconductor structure implementations of the present invention have been adopted from integrated circuit (IC) technology. For example, the semiconductor structure implementations of the present invention may be built on wafers and realized in films of material patterned by photolithographic processes on the top of a wafer. In particular, the fabrication of the semiconductor structure implementations of the present invention may use three basic building blocks: (i) deposition of thin films of material on a substrate, (ii)

applying a patterned mask on top of the films by photolithographic imaging, and (iii) etching the films selectively to the mask.

Figure 1:
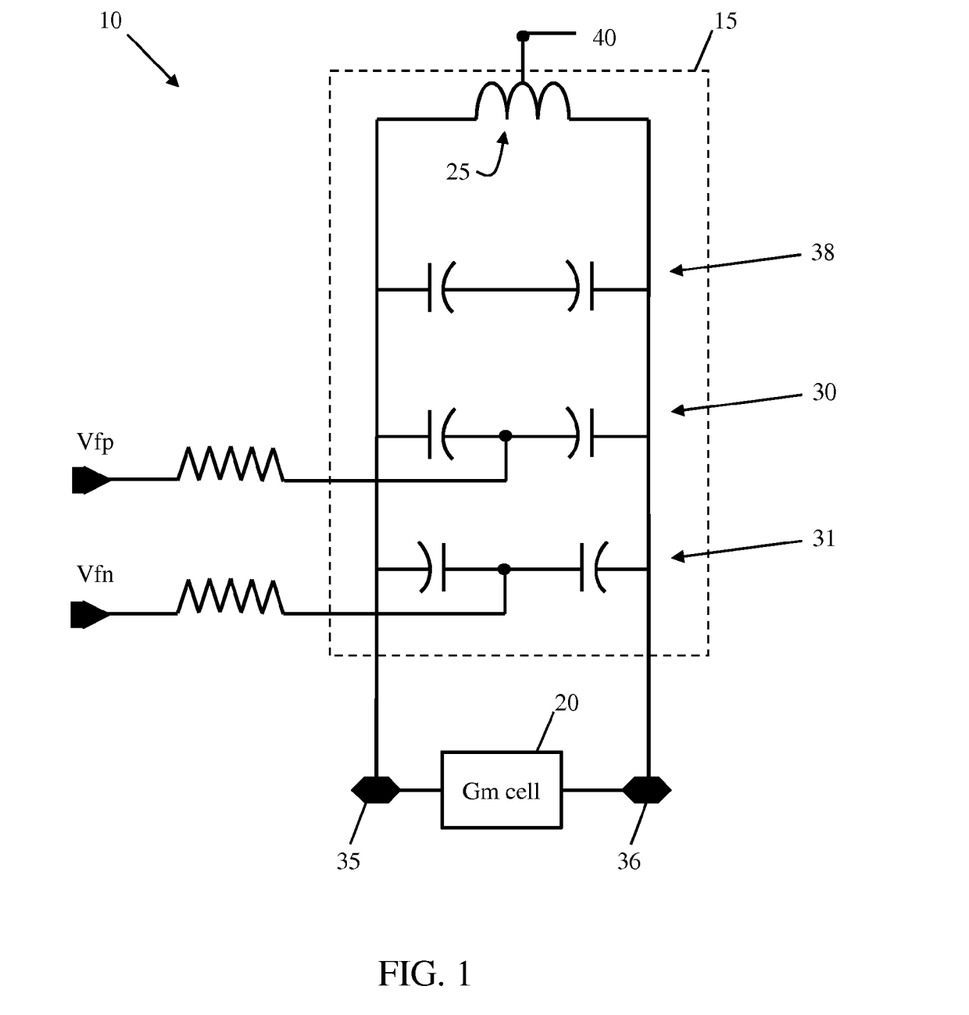
FIG. 1 shows a resonator in accordance with aspects of the invention.

FIG. 1 schematically illustrates a voltage controlled oscillator (VCO) 10 comprising a tank circuit 15 and a transconductance (Gm) cell 20. The tank circuit 15 is an LC tank that includes an inductor 25 and variable capacitors (varactors) 30, 31 connected in parallel between nodes 35, 36. Differential control voltages Vfp and Vfn are selected to adjust the capacitance of each of the varactors 30, 31, which in turn adjusts the output frequency of the VCO. The differential control voltages Vfp and Vfn may be provided by a control circuit such as a filter or charge pump (not shown), e.g., in a PLL that includes the VCO 10. The tank circuit 15 may also include at least one fixed capacitor 38. The VCO 10 may also include a reference signal 40 detected at a tap point of the inductor 25, such as a center tap point of the inductor 25. The reference signal 40 may be provided as a feedback signal to the control circuit and used by the control circuit in adjusting the differential control voltages Vfp and Vfn. The transconductance cell 20 assists in sustaining oscillations by providing a negative transconductance to compensate tank losses that result from finite Q factor of the inductor and capacitors.

Figure 2:
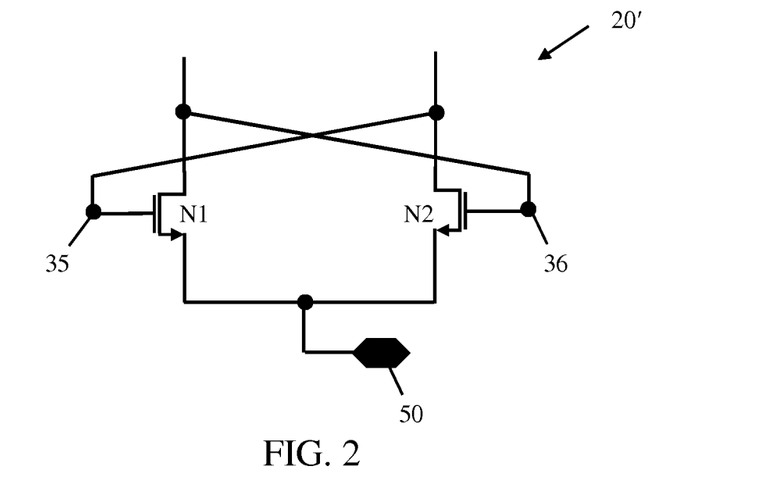
FIGS. 2 and 3 show transconductance cells that may be used with the resonator of FIG. 1.

FIGS. 2 and 3 show transconductance cells that may be used with the VCO 10 of FIG. 1. Specifically, FIG. 2 shows a transconductance cell 20' that may be connected to nodes 35, 36 of the VCO 10. The transconductance cell 20' includes a pair of cross-coupled n-channel metal-oxide-semiconductor field-effect transistor (NFET) devices N1 and N2 in which the gate of N1 is tied to the drain of N2 and the gate of N2 is tied to the drain of N1. The source of N1 and the source of N2 are each tied to a tail 50 that is connected to a current source (not shown). Since the tail 50 is connected to a current source, the transconductance cell 20' limits the voltage swing of the tank circuit to less than a rail to rail swing.

Figure 3:
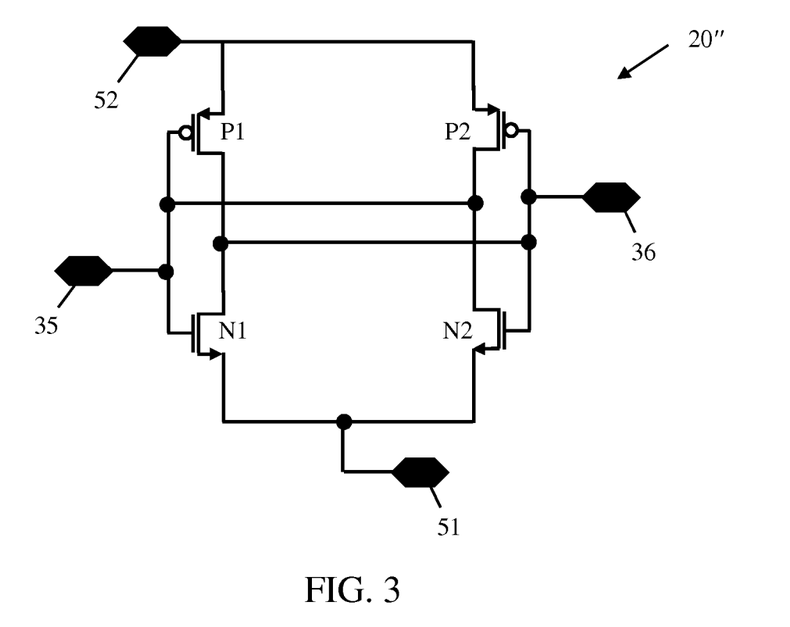

FIG. 3 shows another transconductance cell 20" that may be connected to nodes 35, 36 of the VCO 10. The transconductance cell 20" includes a pair of cross-coupled inverters. The first inverter includes a first NFET device N1 and a first p-channel metal-oxide-semiconductor field-effect transistor (PFET) device P1. The second inverter including a second NFET device N2 and a second PFET device P2. The source of N1 and the source of N2 are each tied to a tail 51 that is connected to ground, e.g., by a switch. The source of P1 and the source of P2 are each tied to a power supply node 52, which may be a rail voltage such as a regulated analog voltage (Vra), for example. Since the transconductance cell 20" is connected between ground at the tail 51 and the rail voltage at the power supply node 52, the transconductance cell 20" provides a swing that is close to rail to rail voltage in the tank circuit, which improves oscillation.

Figure 4:
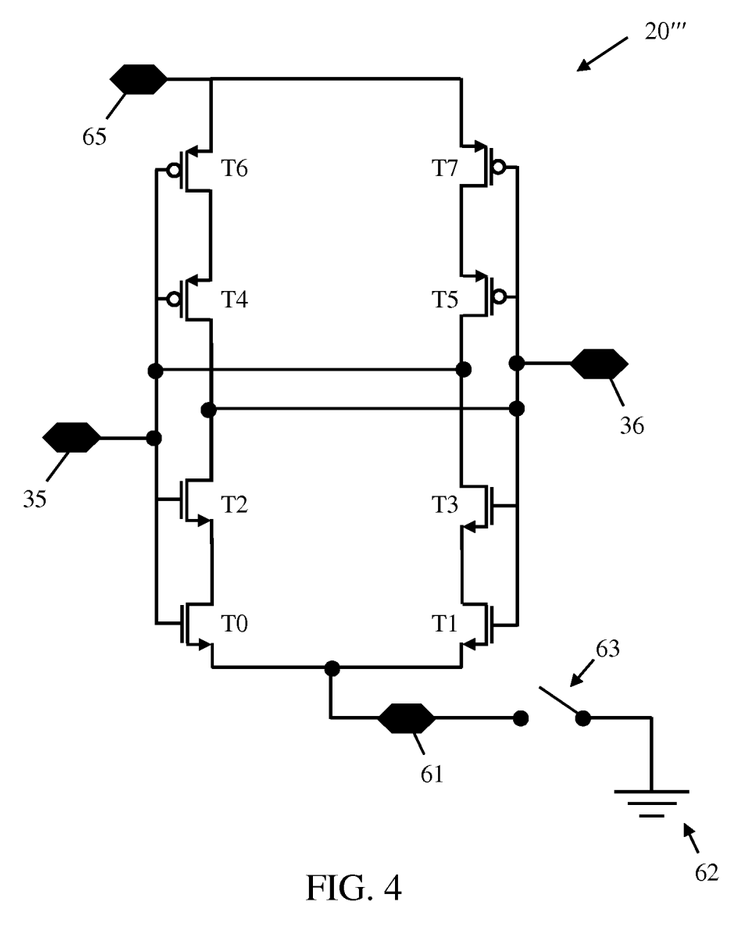
FIGS. 4-6 show transconductance cells in accordance with aspects of the invention.

FIG. 4 shows another transconductance cell 20''' in accordance with aspects of the invention. The transconductance cell 20''' may be connected to nodes 35, 36 of the VCO 10 of FIG. 1, for example. In embodiments, the transconductance cell 20''' includes four NFET devices T0-T3 and four PFET devices T4-T7. As depicted in FIG. 4, the gates of T0, T2, T4, and T6 are all tied together and are connected to the drain of T3 and the drain of T5. Also, the gates of T1, T3, T5, and T7 are all tied together and are connected to the drain of T2 and the drain of T4. The source of T0 and the source of T1 are each tied to a tail 61 that is connected to ground 62, e.g., by a switch 63. The source of T6 and the source of T7 are each tied to a power supply node 65, which may be a rail voltage such as a regulated analog voltage (Vra), for example.

According to aspects of the invention, the drain of T0 is connected to the source of T2 such that T0 and T2 constitute a pair of stacked FETs. Similarly, the drain of T1 is connected to the source of T3, the drain of T6 is connected to the source of T4, and the drain of T7 is connected to the source of T5. In this manner, there is a first NFET stack (T0/T2) connected in series to a first PFET stack (T4/T6), and a second NFET stack (T1/T3) connected in series to a second PFET stack (T5/T7). Comparing the transconductance cell 20" of FIG. 3 to the transconductance cell 20''' of FIG. 4, it is seen that N1 is replaced with stacked pair T0/T2, N2 is replaced with stacked pair T1/T3, P1 is replaced with stacked pair T4/T6, and P2 is replaced with stacked pair T5/T7. Using stacked pairs of FETs in the transconductance cell 20''' reduces the swing from rail to rail but improves noise performance of the VCO in which the transconductance cell 20''' is connected.

Specifically, the use of stacked FET pairs (e.g., T0/T2, T1/T3, T4/T6, T5/T7) in the transconductance cell 20''' in accordance with aspects of the invention advantageously reduces the phase noise in the VCO (e.g., VCO 10) compared to the phase noise associated with the transconductance cell 20" which uses single transistors. Flicker noise (i.e., 1/f noise) decreases as the channel length of a transistor increases. Instead of using longer channel single transistors, implementations of the invention use shorter channel stacked transistor pairs, which result in reduced phase noise that is up-converted from flicker noise.

Still referring to FIG. 4, the transistors T0-T7 may be selected to optimize the VCO oscillation over a predefined frequency range, and to minimize phase noise in all corners of process, voltage, and temperature (e.g., under all PVT/MC conditions). In embodiments, the transistors T0-T7 comprise high threshold voltage transistors (e.g., HVTFETs), although any suitable transistors may be used within the scope of the invention.

Figure 5:
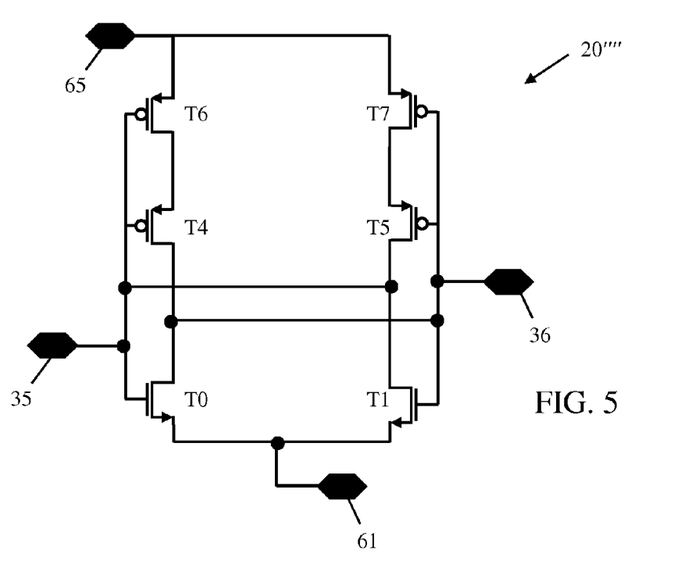
Figure 6:
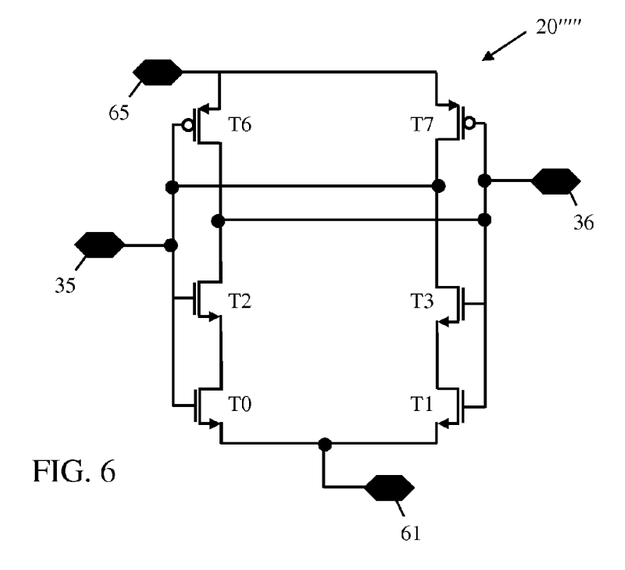

FIGS. 5 and 6 show transconductance cells 20'''' and 20''''' in accordance with aspects of the invention. The transconductance cells 20'''' and 20''''' may be connected to nodes 35, 36 of the VCO 10 of FIG. 1, for example. As described herein, the use of stacked transistor pairs in a transconductance cell (e.g., as shown in FIG. 4) advantageously reduces phase noise but also reduces the voltage swing of the tank circuit. In designs where the reduction of voltage swing is unacceptable, the implementations of the transconductance cell shown in FIG. 5 or FIG. 6 may be used to improve the voltage swing while still obtaining some amount of phase noise reduction.

With specific reference to FIG. 5, transconductance cell 20'''' is similar to transconductance cell 20''' of FIG. 4 with the exception that transconductance cell 20'''' includes single NFET devices T0 and T1 instead of pairs T0/T2 and T1/T3 (as in FIG. 4). The use of single NFET devices T0 and T1 in transconductance cell 20'''' improves the voltage swing compared to the transconductance cell 20''' of FIG. 4 since there is one less Vds drop due to one less transistor in series. The use of stacked pairs of PFET devices T4/T6 and T5/T7 in transconductance cell 20'''' provides some phase noise reduction, albeit less than that realized with transconductance cell 20''' of FIG. 4. For example, the transconductance cell 20''' of FIG. 4 may provide a phase noise reduction of 6-10 dB compared to the transconductance cell 20" of FIG. 3, whereas the transconductance cell 20'''' of FIG. 5 may provide a phase noise reduction of 4-7 dB compared to the same transconductance cell 20".

With specific reference to FIG. 6, transconductance cell 20''''' is similar to transconductance cell 20''' of FIG. 4 with the exception that transconductance cell 20''''' includes single PFET devices T6 and T7 instead of pairs T4/T6 and T5/T7 (as in FIG. 4). The use of single PFET devices T6 and T7 in transconductance cell 20''''' improves the voltage swing compared to the transconductance cell 20′″ of FIG. 4 since there is one less Vds drop due to one less transistor in series. The use of stacked pairs of NFET devices T0/T2 and T1/T3 in transconductance cell 20″″ provides some phase noise reduction, albeit less than that realized with transconductance cell 20′″ of FIG. 4. For example, the transconductance cell 20′″ of FIG. 4 may provide a phase noise reduction of 6-10 dB compared to the transconductance cell 20″ of FIG. 3, whereas the transconductance cell 20″″ of FIG. 6 may provide a phase noise reduction of 4-7 dB compared to the same transconductance cell 20″.

Figure 7:
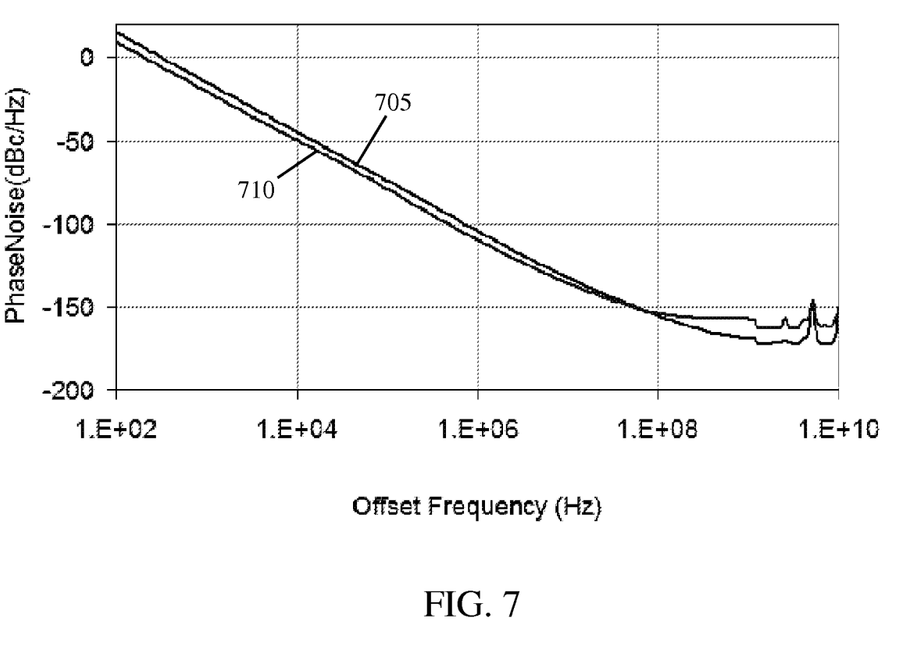
FIGS. 7 and 8 show data of phase noise in accordance with aspects of the invention.

FIG. 7 shows a plot of simulation data for phase noise as a function of offset frequency for both: a transconductance cell that uses single transistors (e.g., as in FIG. 3), and transconductance cell that uses stacked pairs of transistors (e.g., as in FIG. 4). The devices used in this cell are all HVTFETs i.e. high voltage FETs. The horizontal axis represents offset frequency in Hz relative to the carrier frequency, which in this simulation in 2.5 GHz. The vertical axis represents phase noise in dBc/Hz. Curve 705 represents the phase noise for a VCO (e.g., VCO 10) that employs a transconductance cell with single transistors (e.g., transconductance cell 20″ of FIG. 3) with a rail voltage (Vra) of 1.1 V. Curve 710 represents the phase noise for a VCO (e.g., VCO 10) that employs a transconductance cell with stacked transistors (e.g., transconductance cell 20′″ of FIG. 4) with a rail voltage (Vra) of 1.1 V. As can be seen from the curves 705 and 710, the phase noise of the VCO that uses a transconductance cell with stacked transistors is lower by about 6-10 dB than that of the VCO that uses a transconductance cell with single transistors at offset frequencies up to 1 MHz. Therefore, the transconductance cell with stacked transistors (e.g., as in FIG. 4) provides phase noise reduction compared to the transconductance cell with single transistors (e.g., as in FIG. 3).

Figure 8:
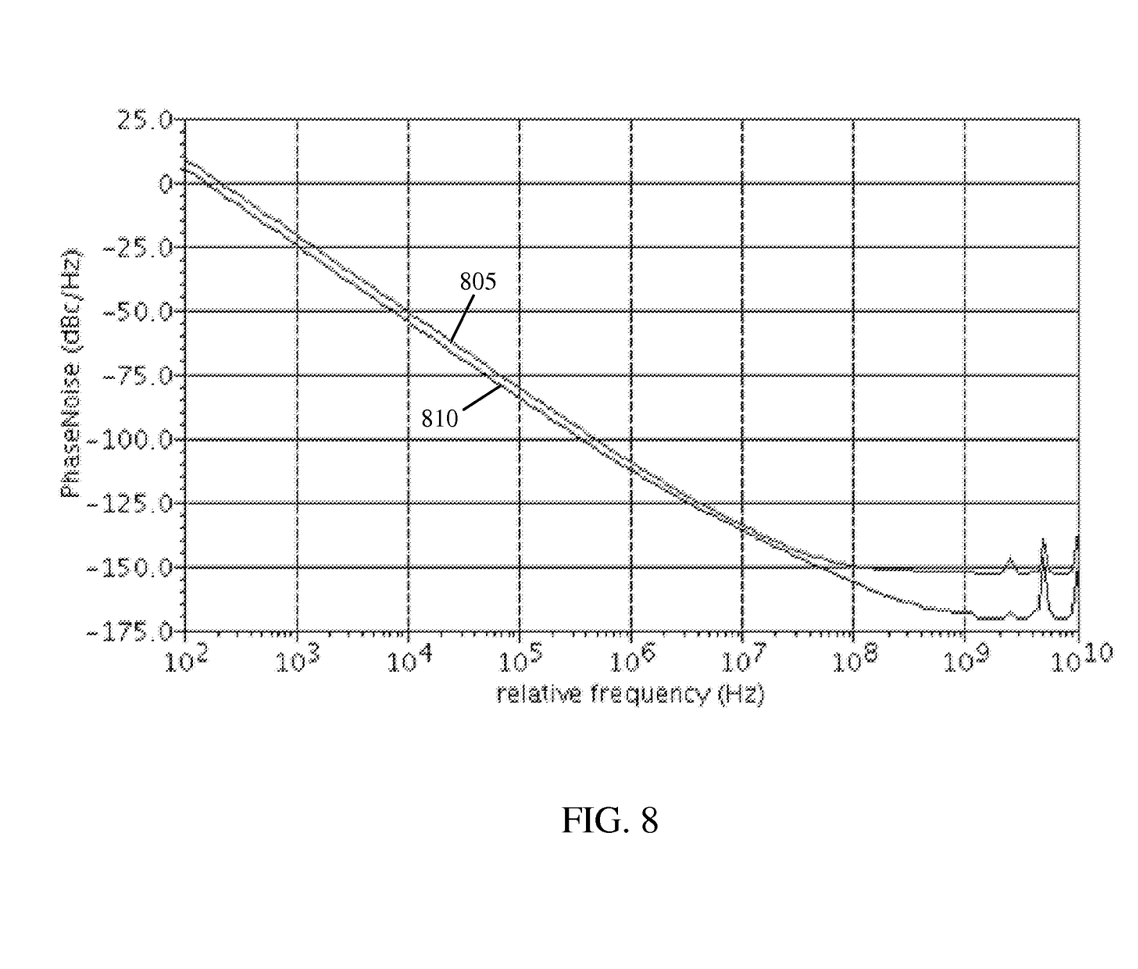

FIG. 8 shows a plot of simulation data for phase noise as a function of offset frequency for both: a transconductance cell that uses single transistors (e.g., as in FIG. 3), and transconductance cell that uses stacked pairs of transistors (e.g., as in FIG. 4). The devices used in this transconductance cell are body contacted FETS, i.e., they are different from those used in the data of FIG. 7. The horizontal axis represents offset frequency in Hz relative to the carrier frequency. The vertical axis represents phase noise in dBc/Hz. Curve 805 represents the phase noise for a VCO (e.g., VCO 10) that employs a transconductance cell with single transistors (e.g., transconductance cell 20″ of FIG. 3) having a channel length of 112 nm, a channel width of 9.1 µm, and a frequency range of 2.3 GHz to 2.87 GHz. Curve 810 represents the phase noise for a VCO (e.g., VCO 10) that employs a transconductance cell with stacked transistors (e.g., transconductance cell 20′″ of FIG. 4) having a channel length of 56 nm, a channel width of 9.6 µm, and a frequency range of 2.3 GHz to 2.87 GHz. The transistors of the transconductance cell associated with curve 810 are sized to provide a same transconductance and same frequency range as the transistors of the transconductance cell associated with curve 805. As can be seen from the curves 805 and 810, the phase noise of the VCO that uses a transconductance cell with stacked transistors is lower by 3 dB than that of the VCO that uses a transconductance cell with single transistors at offset frequencies up to 1 MHz. Therefore, the transconductance cell with stacked transistors (e.g., as in FIG. 4) provides phase noise reduction compared to the transconductance cell with single long channel (i.e., 112 nm in the example) transistors (e.g., as in FIG. 3).

A method according to aspects of the invention includes designing a transconductance cell with stacked transistors. In embodiments, the method includes defining a transconductance cell with single transistors (e.g., as in FIG. 3), and sizing the transistors in a transconductance cell with stacked transistors (e.g., as in FIG. 4) such that the transconductance cell with stacked transistors has the same transconductance (Gm) and/or operating frequency as the transconductance cell with single transistors. In this manner, an existing VCO design that includes a transconductance cell with single transistors may be modified to instead use a transconductance cell with stacked transistors, thereby maintaining the frequency and oscillation characteristics of VCO (e.g., designing for the transconductance cell for the same Gm and frequency range) while advantageously reducing the phase noise of the VCO.

Figure 9:
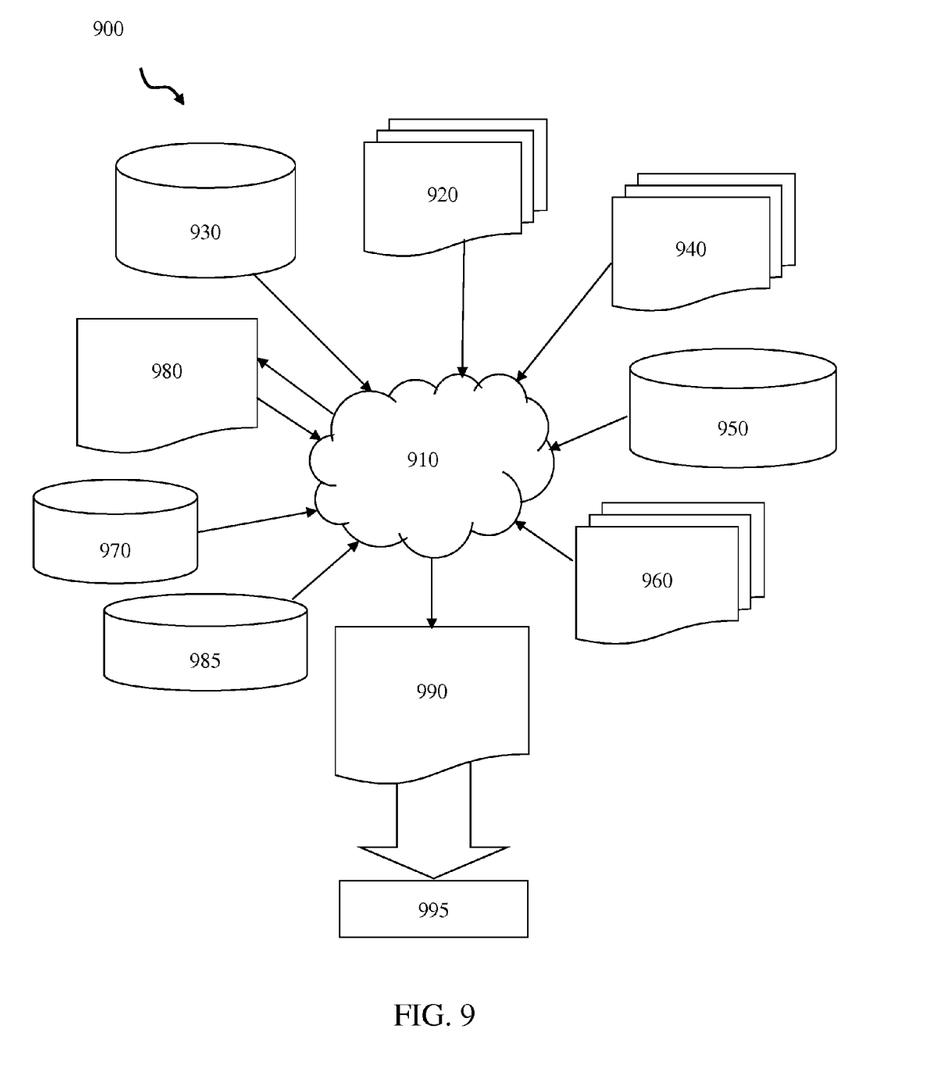
FIG. 9 is a flow diagram of a design process used in semiconductor design, manufacture, and/or test.

FIG. 9 is a flow diagram of a design process used in semiconductor design, manufacture, and/or test. FIG. 9 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-6. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-6. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-6 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the devices shown in FIGS. 1-6. In one embodiment, design structure 990 may comprise a compiled, executable HDL simulation model that functionally simulates the devices shown in FIGS. 1-6.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-6. Design structure 990 may then proceed to a stage 995 where, for example, design structure 990: proceeds to tape-out, is released to manufacturing, is released to a mask house, is sent to another design house, is sent back to the customer, etc.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A transconductance cell for use in a voltage controlled oscillator (VCO), comprising:
   a first NFET stack connected in series to a first PFET stack; and
   a second NFET stack connected in series to a second PFET stack,
   wherein the first NFET stack and the first PFET stack are cross-coupled to the second NFET stack and the second PFET stack;
   the first NFET stack and the second NFET stack are connected to a tail node; and the first PFET stack and the second PFET stack are connected to a power supply node;
wherein the first NFET stack comprises a first NFET and a second NFET;
the second NFET stack comprises a third NFET and a fourth NFET;
the first PFET stack comprises a first PFET and a second PFET; and
the second PFET stack comprises a third PFET and a fourth PFET.

2. The transconductance cell of claim 1, wherein:
the first NFET is connected to the tail node;
the third NFET is connected to the tail node;
the first PFET is connected to the second NFET;
the second PFET is connected to the power supply node;
the third PFET is connected to the fourth NFET; and
the fourth PFET is connected to the power supply node.

3. The transconductance cell of claim 2, wherein:
respective gates of the first NFET, the second NFET, the first PFET and the second PFET are connected to a drain of the fourth NFET and a drain of the third PFET; and
respective gates of respective gates of the third NFET, the fourth NFET, the third PFET and the fourth PFET are connected to a drain of the second NFET and a drain of the first PFET.

4. The transconductance cell of claim 3, wherein:
a drain of the first NFET is connected to a source of the second NFET;
a drain of the third NFET is connected to a source of the fourth NFET;
a source of the first PFET is connected to a drain of the second PFET; and
a source of the third PFET is connected to a drain of the fourth PFET.

5. The transconductance cell of claim 3, wherein:
the respective gates of the first NFET, the second NFET, the first PFET and the second PFET are structured and arranged to be connected to a first node of the VCO; and
the respective gates of respective gates of the third NFET, the fourth NFET, the third PFET and the fourth PFET are structured and arranged to be connected to a second node of the VCO.

6. The transconductance cell of claim 1, wherein:
the tail node is connected to ground by a switch; and
the power supply node is connected to a rail voltage.

7. The transconductance cell of claim 1, wherein:
gates of transistors in the first NFET stack and the first PFET stack are structured and arranged to be connected to a first node in the VCO; and
gates of transistors in the second NFET stack and the second PFET stack are structured and arranged to be connected to a second node in the VCO.

8. The transconductance cell of claim 1, wherein the transconductance cell is structured and arranged to be connected between a first node and a second node of the VCO in parallel with an inductor and a varactor that are connected between the first node and the second node.

9. A transconductance cell for use in a voltage controlled oscillator (VCO), comprising:
a first NFET stack connected in series to a first PFET stack; and
a second NFET stack connected in series to a second PFET stack,
wherein the first NFET stack and the first PFET stack are cross-coupled to the second NFET stack and the second PFET stack;
the first NFET stack and the second NFET stack are connected to a tail node; and
the first PFET stack and the second PFET stack are connected to a power supply node,
wherein transistors of the first NFET stack, the first PFET stack, the second NFET stack, and the second PFET stack are sized to provide a same transconductance and a reduced phase noise relative to another transconductance cell that includes only non-stacked transistors.

10. A voltage controlled oscillator, comprising:
an inductor connected between a first node and a second node;
at least one varactor connected between the first node and the second node; and
a transconductance cell connected between the first node and the second node, wherein the transconductance cell comprises:
a first NFET set connected in series to a first PFET set; and
a second NFET set connected in series to a second PFET set,
wherein the first NFET set and the first PFET set are cross-coupled to the second NFET set and the second PFET set;
the first NFET set and the second NFET set are connected to a tail node that is selectively switched to ground;
the first PFET set and the second PFET set are connected to a power supply node; and
at least one of: the first NFET set and the second NFET set each comprises a pair of stacked NFETs, and the first PFET set and the second PFET set each comprises a pair of stacked PFETs.

11. The voltage controlled oscillator of claim 10, wherein:
the first NFET set comprises only a first NFET;
the second NFET set comprises only a second NFET;
the first PFET set comprises a first PFET stacked in series with a second PFET; and
the second PFET set comprises a third PFET stacked in series with a fourth PFET.

12. The voltage controlled oscillator of claim 10, wherein:
the first PFET set comprises only a first PFET;
the second PFET set comprises only a second PFET;
the first NFET set comprises a first NFET stacked in series with a second NFET; and
the second NFET set comprises a third NFET stacked in series with a fourth NFET.

13. The voltage controlled oscillator of claim 10, wherein the at least one varactor comprises:
a first varactor that receives a first portion of a differential control voltage; and
a second varactor that receives a second portion of a differential control voltage.

14. The voltage controlled oscillator of claim 10, wherein the inductor, the at least one varactor, and the transconductance cell are connected in parallel between the first node and the second node.

15. The voltage controlled oscillator of claim 10, wherein transistors of the first NFET set, the first PFET set, the second NFET set, and the second PFET set are sized to provide a same transconductance and a reduced phase noise relative to another transconductance cell that includes only non-stacked transistors.

16. A method, comprising:
fabricating a transconductance cell for use in a voltage controlled oscillator (VCO), wherein the transconductance cell comprises:

a first NFET stack connected in series to a first PFET stack; and a second NFET stack connected in series to a second PFET stack, wherein the first NFET stack and the first PFET stack are cross-coupled to the second NFET stack and the second PFET stack;

the first NFET stack and the second NFET stack are connected to a tail node that is selectively connected to ground by a switch; and the first PFET stack and the second PFET stack are connected to a power supply node that supplies a rail voltage.

17. The method of claim 16, further comprising:

determining a transconductance of another transconductance cell that includes only non-stacked transistors; and sizing transistors of the first NFET stack, the first PFET stack, the second NFET stack, and the second PFET stack to provide a same transconductance and a reduced phase noise relative to the other transconductance cell.

18. The method of claim 16, wherein the fabricating comprises:

forming the first NFET stack with a first NFET and a second NFET;

forming the second NFET stack with a third NFET and a fourth NFET;

forming the first PFET stack with a first PFET and a second PFET; and forming the second PFET stack with a third PFET and a fourth PFET.

19. The method of claim 18, wherein the fabricating comprises:

connecting the first NFET to the tail node;

connecting the third NFET to the tail node;

connecting the first PFET to the second NFET;

connecting the second PFET to the power supply node;

connecting the third PFET to the fourth NFET; and connecting the fourth PFET to the power supply node.

20. The transconductance cell of claim 8, further comprising:

a second varactor connected between the first node and the second node, wherein the transconductance cell is structured and arranged to be connected between the first node and the second node of the VCO in parallel with the second varactor.

* * * * *